(12) United States Patent
Shimai et al.

(10) Patent No.: US 8,189,169 B2
(45) Date of Patent: May 29, 2012

(54) COOLING APPARATUS AND SUBSTRATE TREATING APPARATUS

(75) Inventors: Futoshi Shimai, Kanagawa (JP); Shigeru Kawata, Kanagawa (JP)

(73) Assignee: Tokyo Ohka Kogyo Co., Ltd., Kanagawa (JP)

( * ) Notice: Subject to any disclaimer, the term of this patent is extended or adjusted under 35 U.S.C. 154(b) by 772 days.

(21) Appl. No.: 12/156,896

(22) Filed: Jun. 5, 2008

(65) Prior Publication Data

US 2008/0304027 A1    Dec. 11, 2008

(30) Foreign Application Priority Data

Jun. 5, 2007   (JP) .................................. 2007-148793

(51) Int. Cl.
*G03B 27/42*  (2006.01)
(52) U.S. Cl. ................. 355/53; 355/30; 355/72
(58) Field of Classification Search .................. 239/132; 355/30, 53, 72
See application file for complete search history.

(56) References Cited

U.S. PATENT DOCUMENTS

| | | | | |
|---|---|---|---|---|
| 2003/0192686 A1* | 10/2003 | Hisai et al. | .................... | 165/201 |
| 2006/0196627 A1* | 9/2006 | Shedd et al. | .................. | 164/371 |
| 2007/0115444 A1* | 5/2007 | Miyazaki | ........................ | 355/30 |

FOREIGN PATENT DOCUMENTS

| | | |
|---|---|---|
| JP | 2004-207750 | 7/2004 |
| JP | 2004-319626 | 11/2004 |
| JP | 2006-294860 | 10/2006 |

\* cited by examiner

*Primary Examiner* — Edward Glick
*Assistant Examiner* — Mesfin T Asfaw
(74) *Attorney, Agent, or Firm* — Carrier Blackman & Associates, P.C.; Joseph P. Carrier; William D. Blackman

(57) ABSTRACT

The object of the present invention is to provide a cooling apparatus which makes it possible to cool a substrate uniformly in a short period of time even if the substrate has a large area. The cooling apparatus 3 comprises a flat-box-shaped body 10, a cooling medium supply tube 11 which is inserted into the body 10, a nozzle 12 which is attached to the cooling medium supply tube 11 so as to eject the cooling medium toward the internal surface of the body, a pipe 13 for withdrawing water (refrigerant) ejected from the nozzle 12 toward the body 10, a chiller 14 for cooling the water from the pipe 13 to a predetermined temperature, and a circulating pipe 15 for sending the water which has been cooled by the chiller 14 back to the cooling medium supply tube 11.

18 Claims, 4 Drawing Sheets

COOLING APPARATUS AND SUBSTRATE TREATING APPARATUS

BACKGROUND OF THE INVENTION

1. Field of the Invention

The present invention relates to a cooling apparatus for cooling a substrate such as a semiconductor wafer or a glass substrate, and a substrate treating apparatus in which the cooling apparatus is incorporated.

2. Description of the Related Art

In order to form a circuit on a surface of a substrate such as a semiconductor wafer or a glass substrate, exposure is performed to a resist film formed on the substrate surface so as to make a predetermined pattern. If the temperature of the substrate is high at the time of such exposure, expansion of the substrate will occur, which results in displacement of the focal length. Therefore, the substrate needs to be cooled to room temperature before the exposure.

For example, patent document 1 discloses that a resist liquid is supplied to a surface of a substrate by a spin coater, a resist film is formed by heating in a baking portion. A cooling plate in a treating unit is used as a place for delivering the substrate when the resist film is cooled by the cooling plate.

Patent document 2 discloses an apparatus which comprises a hot plate for a baking treatment after exposure, a cooling plate for a cooling treatment, and a special arm for delivering between the hot plate and the cooling plate. In this apparatus, if any trouble occurs in a subsequent process, the special arm transfers a substrate which has undergone a baking treatment for a predetermined period of time from the hot plate to the cooling plate so as to decrease the temperature of the substrate to a temperature which does not affect uniformity of the width.

Patent document 3 discloses that a cooling plate is provided in the course of a wafer transfer line, a central table movable in a vertical direction is provided around the center of the cooling plate, and a refrigerant is supplied into the cooling plate, so that heat exchange occurs between the refrigerant and the wafer mounted on the cooling plate.

Patent document 1: Japanese Patent Application publication No. 2004-207750
Patent document 2: Japanese Patent Application publication No. 2004-319626
Patent document 3: Japanese Patent Application publication No. 2006-294860

In a conventional cooling plate (cooling apparatus), a refrigerant passage is formed in an aluminum-alloy block by cutting as shown in FIG. 7. This makes it difficult to manufacture the apparatus, and also results in increase of its weight.

Further, since the distance between the cooling plate surface and the refrigerant varies depending on the place, the surface temperature of the cooling plate becomes non-uniform, which affects the accuracy of exposure. Furthermore, as the substrate becomes larger, the thickness of the aluminum-alloy block is increased, which requires more time to cool the substrate.

SUMMARY OF THE INVENTION

In order to solve the above-mentioned drawbacks, according to the present invention, a cooling apparatus comprises a flat-box-shaped body, a cooling medium supply tube which is inserted into the body, and a nozzle which is attached to the cooling medium supply tube so as to eject the cooling medium toward the internal surface of the body.

Preferably, the nozzle is attached to the cooling medium supply tube such that the cooling medium is ejected at an inclined angle with respect to the internal surface of the body of the cooling apparatus and also the ejection angle expands radially. With this, it is possible to eject the cooling medium uniformly, and prevent the cooling medium from being dispersed, so as to improve the cooling efficiency. However, by attaching the nozzle at an inclined angle with respect to the internal surface of the body, the cooling water will not be ejected to one end of the body of the cooling apparatus. Therefore, preferably, another nozzle is attached to the cooling medium supply tube near one side of the body in a state of being inclined in an opposite direction of the nozzles attached to the other supply tubes.

Also, according to the substrate treating apparatus of the present invention, the above-mentioned cooling apparatus is positioned in front of an exposure apparatus provided in the course of a substrate transfer line.

According to the present invention, since the body of the cooling apparatus may be formed by a thin metal plate, it is possible to reduce the weight of the cooling apparatus. Also, by using a thin metal plate, it is possible to improve the efficiency of cooling a substrate which is in contact with or adjacent to the cooling apparatus. By ejecting cooling water from the nozzle, it is possible to cool the thin metal plate uniformly. Further, the thin metal plate improves thermal conductivity, and the performance is constant irrespective of the size.

DETAILED DESCRIPTION OF THE PREFERRED EMBODIMENTS

Figure 1:
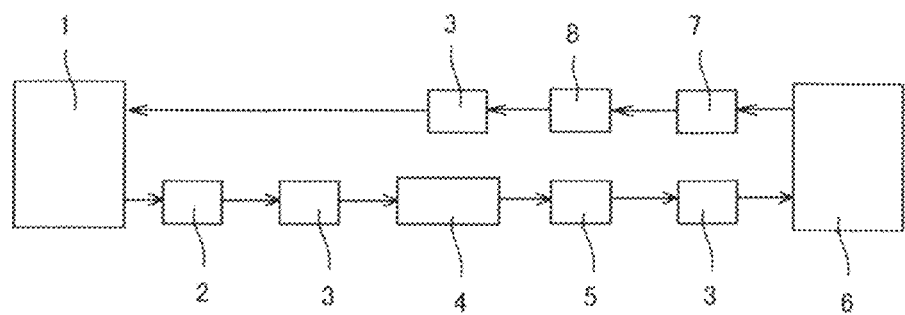
FIG. 1 is a plan view of a substrate treating line in which a cooling apparatus according to the present invention is incorporated.
Figure 2:
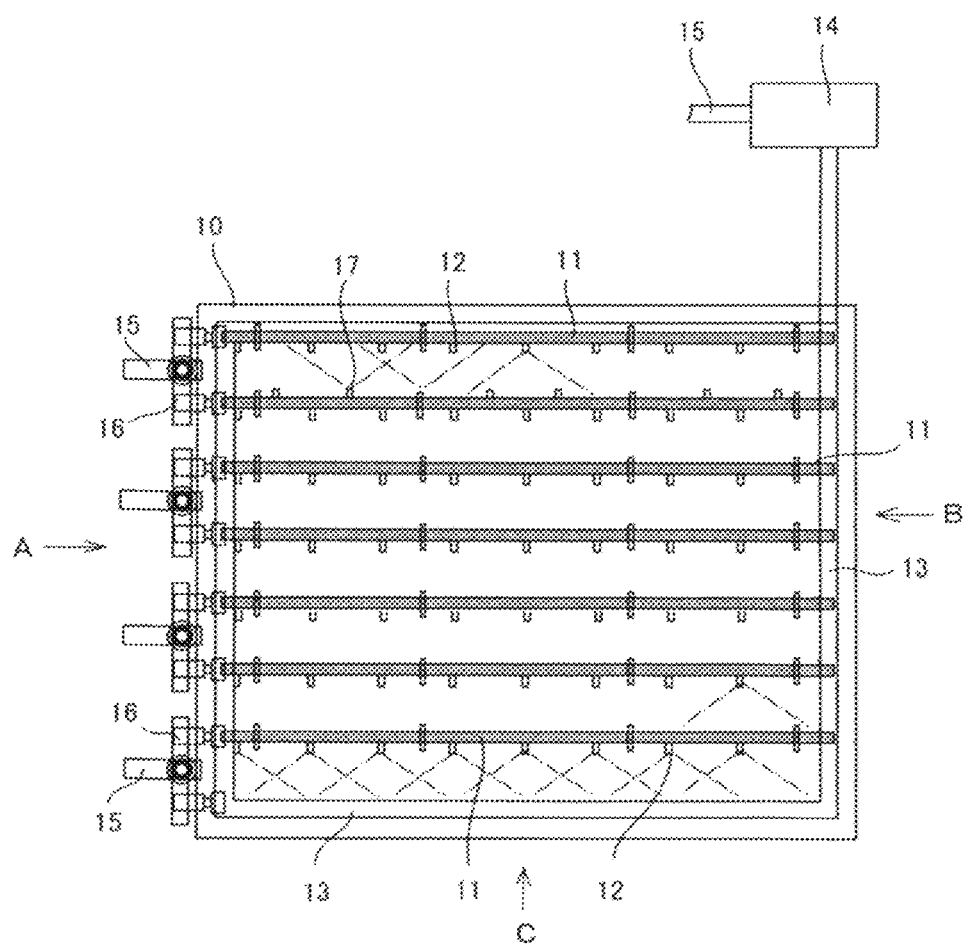
FIG. 2 is a plan view of the internal structure of the cooling apparatus.
Figure 3:
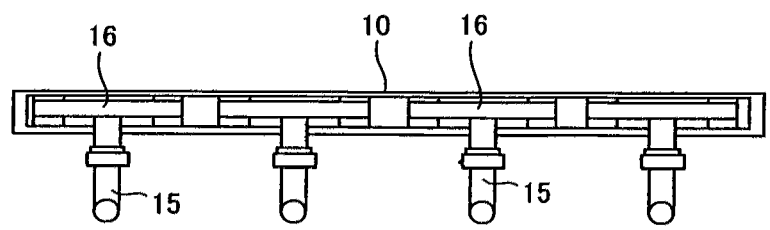
FIG. 3 is a side view seen from A-direction of FIG. 2.
Figure 4:
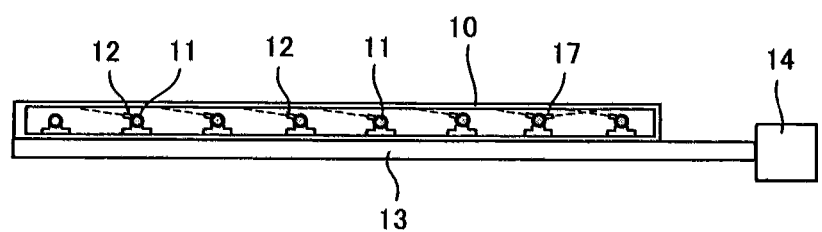
FIG. 4 is a side view seen from B-direction of FIG. 2.
Figure 5:
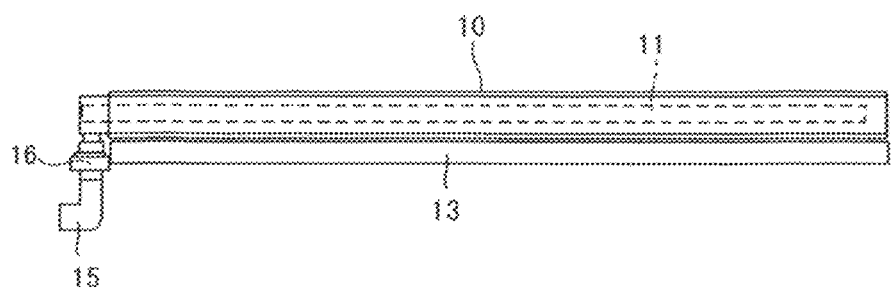
FIG. 5 is a side view seen from C-direction of FIG. 2.
Figure 6:
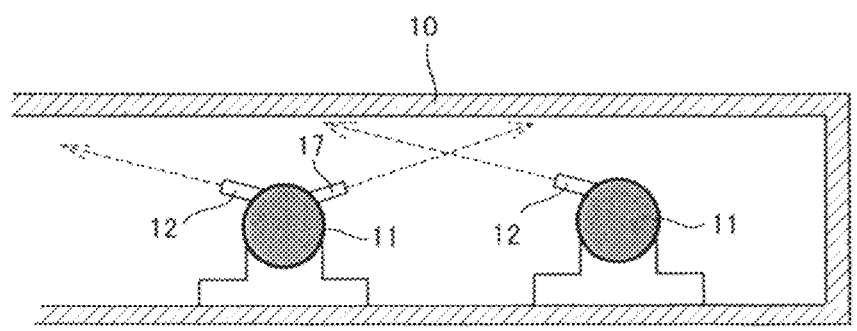
FIG. 6 is an enlarged view of the main part of FIG. 4.
Figure 7:
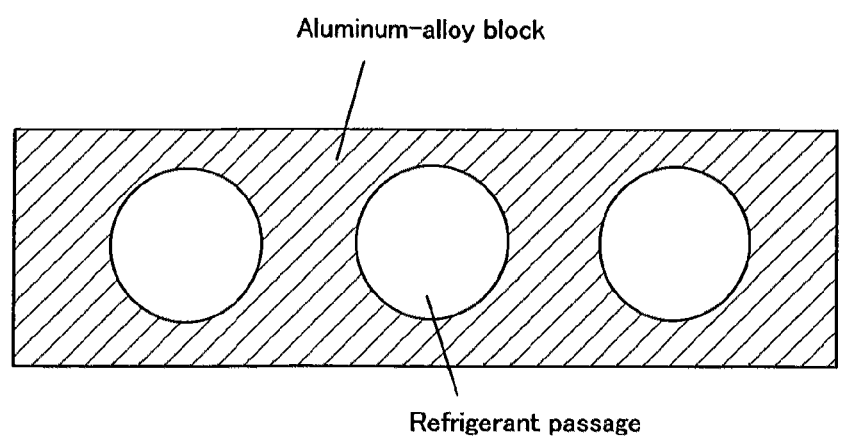
FIG. 7 is a sectional view showing a structure of a conventional cooling plate.

Embodiments of the present invention will now be explained hereunder with reference to the accompanying drawings. FIG. 1 is a plan view of a substrate treating line in which a cooling apparatus according to the present invention is incorporated, FIG. 2 is a plan view of the internal structure of the cooling apparatus, FIG. 3 is a side view seen from A-direction of FIG. 2, FIG. 4 is a side view seen from B-direction of FIG. 2, FIG. 5 is a side view seen from C-direction of FIG. 2, and FIG. 6 is an enlarged view of the main part of FIG. 4.

The substrate treating line comprises a loading and releasing station for a substrate 1, a baking apparatus 2 for removing moisture from the substrate surface, a cooling apparatus 3, a spin-less coating apparatus 4, a pre-baking apparatus 5, another cooling apparatus 3, an exposure apparatus 6, a developing apparatus 7, a post-baking apparatus 8 and another cooling apparatus 3 along a substrate transfer line.

As mentioned above, the substrate treating line comprises a plurality of cooling apparatuses 3. Each cooling apparatus 3 comprises a flat-box-shaped body 10, a cooling medium supply tube 11 which is inserted into the body 10, a nozzle 12 which is attached to the cooling medium supply tube 11 so as to eject the cooling medium toward the internal surface of the body, a pipe 13 for withdrawing water (refrigerant) ejected from the nozzle 12 toward the body 10, a chiller 14 for cooling the water from the pipe 13 to a predetermined temperature, and a circulating pipe 15 for sending the water which has been cooled by the chiller 14 back to the cooling medium supply tube 11.

The body 10 is constructed by bonding metal plates of stainless steel, an aluminum alloy, a cooper alloy, and the like. The wall thickness of the body 10, corresponding to the thickness of each of the metal plates, is 0.5 mm-1 mm. If the top surface of the body 10 is deformed by contacting the substrate because the thickness of the metal plate is small, a rib can be formed on the back side of the top surface so as to prevent the top surface from being deformed.

One end (right end in FIG. 2) of the cooling medium supply tube 11 is closed, and the other end is connected to the circulating pipe 15 via a joint 16.

The axis of the nozzle 12 attached to the cooling medium supply tube 11 is inclined with respect to the top surface of the body 10 so as to eject toward the back side of the top surface of the body 10 obliquely from downward.

By directing the nozzles 12 in the same direction, it is possible to prevent the sprays of water from colliding with each other within the body 10 and prevent the water from coming into contact with the back side of the top surface of the body 10 and from being distributed non-uniformly or falling short, so as to perform efficient cooling. However, if all the nozzles 12 are directed in the same direction, there is a good likelihood that water will not be sufficiently supplied to one end. Therefore, in this embodiment, another nozzle 17 is provided in the supply tube 11 second from the end, and the nozzle 17 is inclined in an opposite direction to the nozzles 12.

In operation, a substrate mounted on the top surface of the body 10 is cooled uniformly by water supplied to the back side of the top surface of the body 10. Incidentally, two cooling apparatuses of the present invention may be provided above and below separately in a state where a substrate is positioned between the cooling apparatuses, so that the substrate is cooled both from above and below.

Also, in the above-described embodiment, the cooling apparatus is provided in the course of a substrate transfer line. However, the cooling apparatus may be applied to a multi-stage heating cooling apparatus in which treatment chambers are superposed in a vertical direction.

What is claimed is:

1. A cooling apparatus for cooling a substrate comprising:
a flat-box-shaped body;
a cooling medium supply tube which is inserted into the body;
a first nozzle which is attached to the cooling medium supply tube so as to eject the cooling medium toward an internal surface of the body, and
a second nozzle attached to another cooling medium supply tube near one side of the body so as to eject the cooling medium toward the internal surface of the body;
wherein the internal surface is a back side of a top planar surface of the body,
wherein the top planar surface of the body is adapted to support a substrate thereon such that the substrate can be cooled by the cooling apparatus;
wherein the first nozzle is inclined with respect to the internal surface of the body, and said second nozzle is inclined in an opposite direction of the first mentioned nozzle.

2. A substrate treating apparatus comprising:
an exposure apparatus which is provided in a substrate transfer line; and
the cooling apparatus according to claim 1 which is positioned in front of the exposure apparatus in the course of the substrate transfer line.

3. The substrate treating apparatus according to claim 2, wherein the internal surface is a back side of a thin metal plate, and an upper side of the thin metal plate forms the top planar surface of the body.

4. The substrate treating apparatus according to claim 3, wherein the thin metal plate has a thickness of approximately 0.5-1.0 mm.

5. The substrate treating apparatus according to claim 2, wherein a space within the body is substantially open such that, apart from the cooling medium supply tubes and the nozzles, the cooling medium ejected from the nozzles can freely flow toward the internal surface of the body.

6. The substrate treating apparatus according to claim 2, wherein the first nozzle is inclined obliquely downward with respect to the internal surface of the body.

7. The substrate treating apparatus according to claim 2, wherein the apparatus comprises multiple said first nozzles provided on multiple said cooling medium supply tubes disposed in spaced relation to each other so as to eject the cooling medium toward the internal surface of the body, wherein said first nozzles are inclined in one direction toward said internal surface of the body.

8. The substrate treating apparatus according to claim 7, further comprising a circulating pipe for introducing the cooling medium into said supply tubes, a pipe for withdrawing the cooling medium from the body after it is discharged from said nozzles, and a chiller which cools the cooling medium before it is reintroduced into the circulating pipe.

9. The substrate treating apparatus according to claim 2, wherein a strength-enhancing rib is provided on the internal surface of the body.

10. The cooling apparatus according to claim 1, wherein the internal surface is a back side of a thin metal plate, and an upper side of the thin metal plate forms the top planar surface of the body.

11. The cooling apparatus according to claim 10, wherein the thin metal plate has a thickness of approximately 0.5-1.0 mm.

12. The cooling apparatus according to claim 1, wherein a space within the body is substantially open such that, apart from the cooling medium supply tube and the nozzles, the cooling medium ejected from the nozzles can freely flow toward the internal surface of the body.

13. The cooling apparatus according to claim 1, wherein the first nozzle is inclined obliquely downward with respect to the internal surface of the body.

14. The cooling apparatus according to claim 1, wherein the apparatus comprises multiple said first nozzles provided on multiple said cooling medium supply tubes disposed in spaced relation to each other so as to eject the cooling medium toward the internal surface of the body, wherein said first nozzles are all inclined in one direction toward said internal surface of the body such that the cooling medium discharges from the first nozzles substantially do not collide with each other within the body and are distributed substantially uniformly over the internal surface.

15. The cooling apparatus according to claim 1, wherein an ejection angle of coolant medium from said nozzles expands radially within said body.

16. The cooling apparatus according to claim 1, wherein a strength-enhancing rib is provided on the internal surface of the body.

17. A cooling apparatus for cooling a substrate comprising:
a flat-box-shaped body;
multiple cooling medium supply tubes inserted in said body in spaced relation to each other; and
multiple nozzles provided on said medium supply tubes so as to eject the cooling medium toward an internal surface of the body,
wherein the internal surface is a back side of a top planar surface of the body,
wherein the top planar surface of the body is adapted to support a substrate thereon such that the substrate can be cooled by the cooling apparatus, and
wherein most of said nozzles are inclined in one direction toward said internal surface of the body, except for one or more nozzles provided on one of said tubes disposed near one side of said body which are inclined in an opposite direction toward the internal surface.

18. The cooling apparatus according to claim 17, further comprising a circulating pipe for introducing the cooling medium into said supply tubes, a pipe for withdrawing the cooling medium from the body after it is discharged from said nozzles, and a chiller which cools the cooling medium before it is reintroduced into the circulating pipe.

* * * * *